United States Patent [19]

Jackson et al.

[11] 4,394,183
[45] Jul. 19, 1983

[54] SOLIDIFICATION OF MOLTEN MATERIALS

[75] Inventors: Kenneth A. Jackson, Plainfield; Lionel C. Kimerling, Westfield, both of N.J.

[73] Assignee: Bell Telephone Laboratories, Incorporated, Murray Hill, N.J.

[21] Appl. No.: 322,575

[22] Filed: Nov. 18, 1981

[51] Int. Cl.³ .......................................... H01L 21/24
[52] U.S. Cl. .................................... 148/1.5; 148/171; 148/179; 75/65 ZM; 156/604
[58] Field of Search ..................... 148/1.5, 171, 179; 156/604; 29/65 ZM

[56] References Cited

U.S. PATENT DOCUMENTS

| | | | |
|---|---|---|---|
| 2,739,088 | 3/1956 | Pfann | 148/1 |
| 2,813,048 | 11/1957 | Pfann | 148/1 |
| 3,179,542 | 4/1965 | Quinn et al. | 148/179 X |
| 3,940,289 | 2/1976 | Marquardt et al. | 148/1.5 |
| 4,033,786 | 7/1977 | Anthony et al. | 148/179 X |
| 4,136,435 | 1/1979 | Li | 148/1.5 X |
| 4,257,824 | 3/1981 | Jackson et al. | 148/1.5 |

OTHER PUBLICATIONS

B. Chalmers, *Principles of Solidification,* Chapt. 4, "Microscopic Heat Flow Considerations" and Chapt. 5, Redistribution of Solute During Solidification, pp. 91–180, (1964).

*Primary Examiner*—G. Ozaki
*Attorney, Agent, or Firm*—Samuel H. Dworetsky

[57] ABSTRACT

This invention is a technique for forming a specifically configured region of material which is rejected by an advancing freezing front within a melt. Resolidification of the molten material is effected in such a manner that liquid-solid interfaces intersect so as to control the shape and location of the rejected material which solidifies. Specific embodiments involve the formation of wires, tubes, or planes of enriched rejected material. Applications include the formation of enriched conductive material for making electrical contact between internal or external regions of electronic devices. Additionally, enriched material with etching properties different than that of the surrounding material may be formed and subsequently etched away in micro-machining applications.

24 Claims, 4 Drawing Figures

SOLIDIFICATION OF MOLTEN MATERIALS

BACKGROUND OF THE INVENTION

1. Field of the Invention

This invention involves solidification of molten materials to yield desirable physical and/or compositional configurations.

2. Disclosures of Interest

Compositional changes which occur upon solidification of molten materials comprising two or more components are well known and have been studied in detail. (See, for example, Bruce Chalmers, *Principles of Solidification,* John Wiley and Sons, Inc., New York, 1964, especially pp. 120–180 and references cited therein.) If one of the components of the melt has a higher solubility in the liquid phase than in the solid phase, that component will be "rejected" as a freezing liquid-solid interface advances through the melt during solidification. (See, for example, *Principles of Solidification,* ibid., pp. 128–143.)

On Mar. 20, 1956, U.S. Pat. No. 2,739,088 was granted to W. G. Pfann for a process of producing compositional and/or physical changes in a body by causing a molten region to travel through the body. In an embodiment of that process, a portion of an appropriate body of material such as, for example, a cylindrical body of semiconductor material, is rendered molten by a heat source which may be made to traverse the body. Traversal of the heat source results in concomitant motion of the molten region through the material, melting solid material in its path and leaving refrozen solid material in its wake. The molten material generally comprises at least two components, and depending upon the phase equilibrium properties associated with this two component material, the refrozen material left in the wake of the molten region may be of higher purity than before the process, or may be doped with desirable impurities as a result of the passage of the molten zone.

On Nov. 12, 1957, W. G. Pfann was further granted U.S. Pat. No. 2,813,048 to a zone melting process descriptively titled "Temperature Gradient Zone Melting" (TGZM). In this process, a traversing heat source is not necessarily used to move the molten zone through the body, but rather an appropriate temperature gradient, which may remain stationary, results in traversal of the molten zone through the body. In the TGZM process, the temperature gradient which is impressed upon the body, in conjunction with phase equilibrium properties associated with the multi-component material, results in a molten region with a spatial variation in concentration of at least one of the components, for example, the solute. At the hotter of the liquid-solid interfaces associated with the molten region equilibrium solute concentrations are lower than at the cooler of the liquid-solid interfaces associated with the molten region. The resultant diffusion of the solute from the cooler liquid-solid interface through the molten region to the hotter liquid-solid interface, in an attempt to reach an approximately uniform concentration, tends to raise the solute concentration at the hotter liquid-solid interface above that value determined by the liquidus for the composition. Solvent material is then dissolved at the hotter liquid-solid interface in an attempt to return the liquid to the liquidus concentration. Similarly, diffusion of the solute away from the cooler interface lowers the solute concentration at that interface and solvent material is refrozen at the cooler interface in an attempt to return that interface to the liquidus concentration. In this manner, the molten region advances through the body melting solid material at the hotter interface and refreezing liquid material at the cooler interface.

On Mar. 24, 1981, K. A. Jackson, L. C. Kimerling, and H. J. Leamy were granted U.S. Pat. No. 4,257,824 to an improved temperature gradient zone melting process. In this process, the molten zone is preferentially heated thereby selectively establishing a temperature gradient across the molten zone. Such selective establishment of a temperature gradient across the molten zone may be effected by using a laser as the heat source. In specific embodiments, the molten zone is essentially the only region of the material which absorbs energy from the laser light beam. In any event, as in previous temperature gradient zone melting processes, a molten region is passed through the body leaving in its wake a solid region of alloy whose composition is determined by the characteristics of both the heating mechanism and the phase diagram association with the material.

The rejection of solute at the liquid-solid interface of an advancing solidification front may result in regions of high solute concentration at grain boundaries. This phenomenon, known as grain boundary segregation, results from segregation of the solute in the last volume to solidify, and is exemplary of a number of different segregation phenomena associated with the advance of a liquid-solid interface upon resolidification. (See, for example, *Principles of Solidification,* ibid., pp. 171ff.) Most of these phenomena, however, are associated with random events which cannot be easily controlled. Hence, enriched solute regions of a predetermined physical configuration were apparently not amenable to easy formation using the characteristic phenomena which occur during redistribution of a solute upon solidification.

SUMMARY OF THE INVENTION

This invention is a technique for forming specifically configured regions of enriched "solute" material by solidifying molten materials. For example, an embodiment of the technique involves forming a small diameter (less than 10 microns) "wire" of enriched "solute" material surrounded by a cylindrical region of a solute-solvent alloy.

The inventive process involves resolidifying a molten material in such a manner that liquid-solid interfaces intersect at some point within the molten material so as to control the shape and location of the "solute" volume which solidifies. At the locus of the intersecting interfaces, solute, or in some embodiments solvent material will solidify, with resultant concentration higher than that in the initial molten phase just before the onset of solidification. The advancing liquid-solid interfaces may be controlled and caused to intersect through the use of appropriate temperature distributions which result in desirable temperature gradients. Since the molten material refreezes along a direction determined by the temperature gradients, the resolidifying liquid-solid interfaces will intersect under the influence of the temperature gradients.

If a "wire" of conductive solute is formed using the inventive process, the "wire" may be used to make electrical contact between various internal or external portions of the body, for example, in the fabrication of electronic devices. Alternatively, the solute "wire" may be preferentially etched away to yield a very small tubular region for use, for example, in electrostatic ink-jet printing. In such applications, the wire need not be conductive, but rather the material used to form the wire will be selected in part for its differential etch characteristics.

In the formation of an exemplary "solute" wire, the diameter of the wire is determined by associated phase equilibria characteristics as well as by the relative values of solute diffusion and thermal cooling of the body. In any event, it is important to realize that the diameter of the solute wire is not limited by the physical size of the molten region but may in fact have a much smaller diameter. In embodiments of this invention, aluminum wires of diameters less than 5 microns are obtained using molten regions of diameter greater than 10 microns.

DETAILED DESCRIPTION OF THE INVENTION

The invention, in its broadest embodiments, is a technique for solidifying a melt which comprises at least two components. The solubility of at least one component is greater in the molten phase than it is in the solid phase. Consequently, when the melt refreezes, that component is at least partly rejected and a region of solid material is ultimately obtained with concentration of the rejected component higher than the average concentration in the initial liquid phase before the onset of solidification, i.e., the rejected component is "enriched". In some embodiments the concentration of at least one component exceeds the solubility limit for that component in the solid phase and a second phase occurs upon solidification. In the inventive process, the refreezing configuration is arranged so that refreezing faces intersect with one another. Upon solidification, the region of high concentration of the rejected component usually occurs at the locus of the intersecting refreezing faces.

Figure 1:
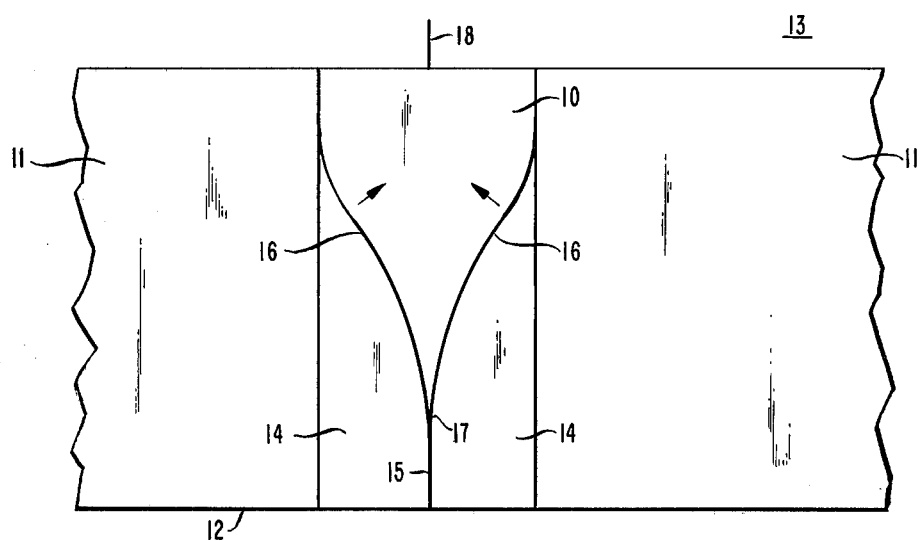
FIG. 1 is a schematic representation of a body in which a molten zone is refreezing according to the teachings of this invention.

The invention may be more easily visualized with reference to FIG. 1. In this FIGURE, 13 is a body of material comprising elements which need not necessarily be related to the components which make up the melt. 10 is a column of material which is rendered molten. To simplify this discussion, the body of material 13 will be considered to be silicon, with 11 the silicon regions, and the melt 10 will be considered to be an alloy of silicon and aluminum. In the FIGURE, the lower portion of the columnar melt is shown refreezing. For purposes of discussion, it may be considered that the heat source, 18, which maintained the columnar melt 10 has been removed and that as a result, the columnar melt is refreezing from bottom to top. However, because of the thermal gradients which have been purposely imposed upon the body by the heat source, 18, the refreezing section of the melt comprises what may be viewed as two faces 16 which intersect in this diagram at 17. Intersection may occur at a small angle as shown or at a much larger angle.

The discussion to this point has been in terms of intersecting refreezing solid-liquid interfaces. However, the two interfaces which intersect may just as well be considered to be one curved interface. Consequently, the intersecting interfaces may be described as a curved interface with at least two tangents, taken from portions of the interface, which intersect. Rejected material is "trapped" at the locus of the intersecting tangents and solidifies there.

In accordance with phenomena well known in the art, one component of the melt may be rejected from the solid phase as it freezes and pushed ahead of the refreezing face at the liquid-solid interface. In FIG. 1, the motion of the liquid-solid interface, 16, is shown generally by the arrows. While some rejected material will continue to be pushed upward in front of the liquid-solid interface, other portions of rejected material will be trapped at the intersection point yielding a "wire" 15 of enriched rejected materials. The invention lies, in part, in the realization that through the imposition of appropriate thermal gradients, the refreezing faces may be caused to intersect thereby yielding a region of enriched rejected material with a physical configuration—in the case of FIG. 1, a "wire"—determined by the geometrical characteristics of the intersecting faces. For example, refreezing faces, the locus of whose intersecting points form a plane, will yield an enriched sheet, and refreezing faces, the locus of whose intersecting points form a circle, will yield an enriched tube.

It should be noted that the region of enriched rejected material, 15, will most often be surrounded by a region, 14, of solidified alloy material. As will be discussed below, the composition of the enriched region 15 and of the alloy region, 14, may be chosen with a view toward subsequent application. For example, the enriched region 15 may be selected to be conductive whereas the solidified alloy region 14 may be insulating, such as, for example, Cu and $Cu_2O$, or gold and gold doped silicon. In this manner, the "wire" may be used to make isolated electrical contact between front and rear portions of the body 13 or between various internal portions of the body 13 in, for example, a layered electronic device. Alternatively, the characteristics of the enriched region 15 and the alloy region 14 may be selected for their differential etching properties (etching properties differing by at least a factor 10) permitting the etching away of the wire 15 to yield a finely "machined" hole through the body 13 for use, for example, in ink-jet printing. To this manner, the invention may be applied to micro-machining needs. These, as well as other applications, all fall within the broad concept of the inventive process.

An aspect of the invention involves the techniques used to ensure that refreezing fronts in a melt will intersect. One technique which may be used by the practitioner to guarantee the intersecting fronts involves the use of appropriately directed thermal gradients. Since the liquid-solid front will advance along the direction of the thermal gradient, appropriate orientation of these gradients will ensure the intersection of the refreezing fronts and the consequent formation of a region of enriched rejected material of desirable physical configuration.

One technique which may be used involves the application of a point heat source to the melt. So for example in FIG. 1, if 18 represents a point heat source which is used to form and/or maintain melt, it is clear that isotherms will be curved around the point of application of the heat source to the melt. Upon removal of the heat source the resultant temperature gradients will be approximately as shown by the arrows in FIG. 1 yielding the intersecting interfaces shown.

While point heat sources which may be used in the practice of this invention may include focused light, electron beams, ion beams, or simple resistor heat sources, one advantageous technique involves the use of a laser of appropriate wavelength. It, of course, will be understood that the wavelength of the laser may differ depending upon whether the laser is used simply to maintain the melt or whether it is used to form and maintain the melt. Furthermore, in certain embodiments, at least two different heat sources may be used to form the melt and subsequently to maintain the melt.

In solid silicon, 10.6 micron light emitted by the $CO_2$ laser is transmitted and will not be significantly absorbed. However, a layer of aluminum on the backside of the substrate, represented in FIG. 1 by 12, will absorb the 10.6 micron $CO_2$ laser light and will melt and subsequently melt silicon as well. The resultant aluminum silicon melt will absorb the 10.6 micron $CO_2$ laser light. Alternatively, for example, a Nd-YAG laser may be used, whose 1.06 micron light is absorbed by silicon. Such a laser may be used to maintain the melt or even in some circumstances to form the melt. In either event, the use of a heat source of limited extent such as a laser to maintain the melt may yield the necessary temperature gradients. When the laser, or other point source, is turned off, cooling will occur along appropriate temperature gradients and the refreezing fronts will advance as shown schematically in FIG. 1 yielding the region of enriched rejected material as described above.

The invention in the first instance is not concerned with the techniques used to form the melt. In fact, the melt may be formed in a separate step and injected into a casting form where it refreezes according to the techniques taught by this invention. However, a particularly useful process for forming a melt involves the temperature gradient zone melting process described above and disclosed in U.S. Pat. Nos. 2,813,048 and 4,257,824. An embodiment of temperature gradient zone melting as applied to the schematic representation of FIG. 1, would involve, in an exemplary process, a silicon body 13 on the backface, 12, of which an aluminum layer is formed. Irradiation of the body 13 with appropriate laser light 18, such as 10.6 micron $CO_2$ laser light, results in transmission of laser light through the body to the aluminum layer at 12. The aluminum layer melts and portions of the silicon body are melted along with the aluminum. In the temperature gradient zone melting process, a molten region is formed which advances through the body to its front face leaving in its wake aluminum doped silicon. As described above, the driving force causing motion of the molten region through the body in the temperature gradient zone melting process involves the diffusion of solute component through the molten region, and the resultant melting of the silicon at the hot liquid-solid interface and resolidification of aluminum doped silicon at the cool interface, in an attempt to return the solute concentration within the molten range to phase equilibrium values. It is important to note that under such circumstances, the resolidification at the cooler liquid-solid interface of the molten region is due not to thermal cooling but rather to a physical/chemical phenomenon associated with the equilibrium values of the multi-component material and the associated phase diagram. As described above, in the invention described here, refreezing occurs when the heat source is removed, and under such circumstances freezing is due not to the physical/chemical phenomenon associated with the phase diagram, but rather is due to the thermal cooling of the molten zone. Consequently, the refreezing faces follow impressed temperature gradients and may be caused to intersect by impression of appropriate temperature gradients.

While the temperature gradient zone melting process usually involves the formation of a molten region of limited extent when compared to the dimensions of the body, its application to the present invention may involve the formation of molten regions of extended dimensions. For example, in FIG. 1, temperature gradient zone melting would most often involve a molten region, of limited thickness when compared to the column shown in the body, which would traverse the body along the column shown. The present invention, however, will most often involve molten regions of greater extent. For example, in FIG. 1, the entire column may be rendered molten before the heat source is removed and refreezing initiated. The laser may be used to render the entire column molten by providing sufficient aluminum, for example at the far face 12, so that the refreezing at the cooler face, which normally occurs in temperature gradient zone melting in order to increase the aluminum concentration which has been lowered by diffusion of aluminum to the hotter face, will not occur. That is, the concentration of aluminum in the molten zone is sufficiently high (generally greater than the liquidus concentration for all temperatures used to maintain the melt) so that refreezing is not necessary to raise the concentration in response to the diffusion of the aluminum away from the cooler face. W. G. Pfann, in his first disclosure of temperature gradient zone melting appreciated the possibility of maintaining such a molten region when sufficient solute such as aluminum is provided. (See, for example, U.S. Pat. No. 2,813,048, column 15, lines 24 ff). In that disclosure W. G. Pfann suggested the removal of such a molten region, for example, by a blast of air, so as to obtain holes, slots, grooves or other shaped openings in blocks of fusible material. Clearly, however, the width of such a hole, obtained according to the teachings of Pfann, would be determined by the width of the molten region as shown in FIG. 10. However, according to the teachings of the present invention when used for micro-machining, e.g., when the wire is differentially etched away, the width of the machined hole is determined by the width of the enriched region of rejected material, 15, and may be much narrower than the width of the molten region. For example, less than 5 micron diameter wires may be obtained from a molten region which is greater than 20 microns in diameter allowing for a machined hole one-fourth the diameter of that obtained if the teachings of W. G. Pfann were followed.

Figure 2:
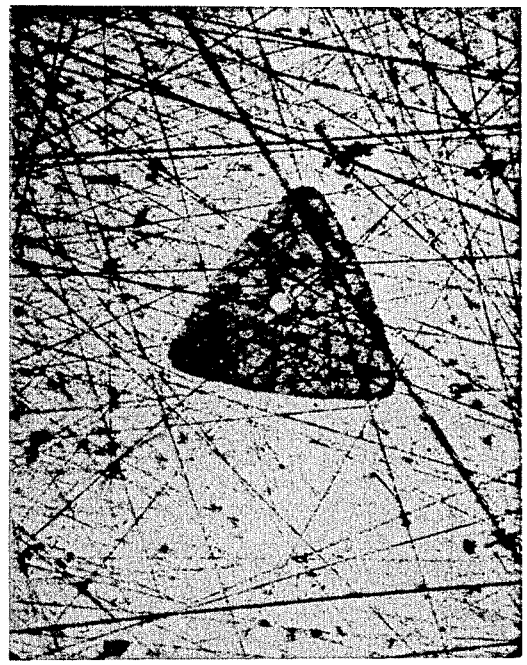
FIG. 2 is a photographic representation of a "solute wire" formed by the inventive process.

FIG. 2 is a photograph of an enriched aluminum wire within a silicon body obtained using the techniques of this invention. When the silicon body is a triangular column of aluminum-silicon alloy the triangular shape is associated with preferred crystal orientations within the silicon. At the center of the triangular column is a 1.5 micron diameter "wire" of "enriched" aluminum. The alloy and the surrounding body may form a single crystal structure.

Figure 3:
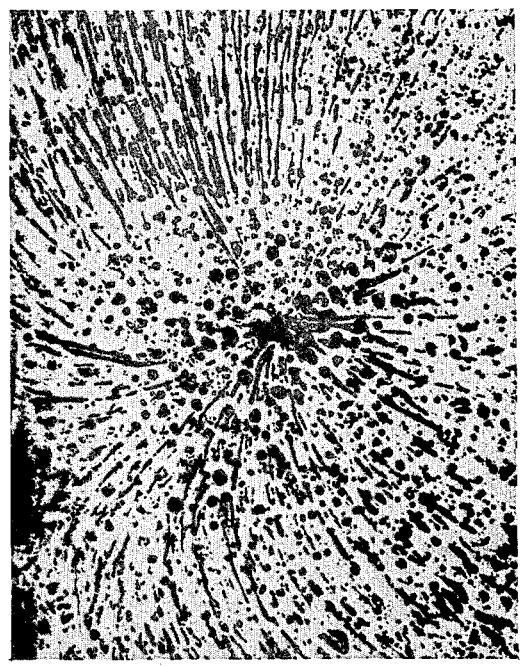
FIGS. 3 and 4 are photographic representations of the appearance of the source of "solute" material subsequent to processing.
Figure 4:
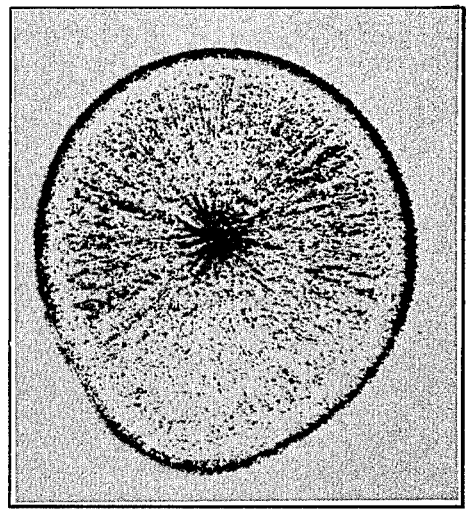

FIGS. 3 and 4 are photographic representations of the backside of the substrate, represented in FIG. 1 as 12. In FIGS. 3 and 4 the backside of the substrate was coated with a layer of aluminum and FIGS. 3 and 4 demonstrate how the aluminum is drawn up into the molten zone where it results in the molten zone remaining molten, and being the last to freeze, because of the large concentration of aluminum. In FIG. 4 the region of "drawn-up" aluminum may be as great as a few millimeters through the molten region is 11$\mu$ and the "wire" is 1.5$\mu$.

In order for material to be rejected in front of a freezing face, such material must have a higher solubility in the liquid than in the solid. If the material exists in the liquid at concentrations even higher than the solubility limit for the associated solid phase, a second solid phase is created upon refreezing. In either event, upon solidification of the molten region the material must be rejected into the remaining molten zone. In the embodiment of the invention which uses a laser as the heat source, appropriate temperature gradients are obtained and removal of the heat source will result in intersecting refreezing faces as shown in FIG. 1 yielding a region 15 of enriched rejected material.

The region 15 will usually be the last to refreeze since in many embodiments its solidification temperature will be much lower than the solidification temperature of the resultant alloy 14. If a pool of rejected material remains at the bottom of face 12 throughout the process it is likely that the entire wire of rejected material will remain molten until the entire column of alloy 14 freezes. Only then will the molten wire freeze. This will be especially true when the enriched region is a metal such as aluminum which has high thermal conductivity.

The description to this point has been in terms of formation of a region of material high in concentration of rejected component material. The disccusion has not been primarily in terms of solutes or solvents. Depending upon the characteristics of the molten region the solvent may be rejected or the solute may be rejected. The practice of the invention is not dependent on whether the rejected material can technically be referred to as the solute or the solvent. It depends only on the formation of a region of enriched rejected material. Likewise, the temperature gradients may be such that the direction of motion of the refreezing faces shown in FIG. 1 would be outward rather than inward as shown in the FIGURE. This, top, would be within the spirit of the invention as long as a region of enriched rejected material is obtained at the intersection of the freezing faces. In any embodiment where the freezing phases are moving outwardly, it is likely that the material left behind would be the first to freeze, rather than the last, but this, too, is not critical to the practice of the invention.

As described above, the particular technique used to form the melt is not critical to the practice of this invention. The melt may be formed using the same heat source which is used to maintain the melt and to obtain appropriate temperature gradients, or the melt may be formed by some totally different technique and inserted into a body where it will be frozen in a casting type process. These and other variations all fall within the spirit of the invention.

As described above, application of the invention may be extended to diverse processing techniques including the formation of contacts between various portions of a body in, for example, the fabrication of electronic devices. In these embodiments the conducting wire may be surrounded by an insulating alloy. Alternatively, the differential etching characteristics of the "wire" and the surrounding alloy material may be such that the invention will be applied to micro-machining with subsequent etching of the central "wire" to obtain a narrow machined whole. Such holes may be used, for example, in ink-jet printing devices.

EXAMPLE

A sample of silicon was prepared by cutting, grinding, and Syton polishing a wafer to a mirror finish with a thickness of 10 mils. A layer of aluminum 2000 Angstroms in thickness was applied to the "backside" of the wafer. The "front" side of the wafer was illuminated with a carbon dioxide laser beam which was continuous and focused by a germanium lens to a spot which measured 100 microns in diameter.

Aluminum was observed to penetrate the front surface in times of 15 minutes, 2 minutes, and 30 seconds for incident laser powers of approximately $2 \times 10^4$ Watts/cm$^2$, $2.5 \times 10^4$ Watts/cm$^2$, and $3 \times 10^4$ Watts/cm$^2$, respectively. In all cases, an initiation exposure of 5 seconds at $4 \times 10^4$ Watts/cm$^2$ was employed prior to the longer exposures. FIGS. 4 and 5 indicate the condition of the backside after exposure. The dark zone represents the region of the metallization which was heated above the aluminum-silicon eutectic melting point of 577 degrees Centigrade. The FIGURES show evidence of the radial temperature gradient which induces the molten alloy to migrate toward the central region by a TGZM phenomenon.

The samples were sectioned by grinding with 600 grit and polishing with a diamond impregnated paste. A 5:nitric+3:acetic+3:hydrofluoric acid etch was employed to reveal compositional differences and p-n junction location. FIG. 2 shows the results of exposure to the stain etch for the sample exposed to the minimum power at a position of 5 mils from the bottom. The triangular region corresponds to a p-type, aluminum doped silicon zone which was initially part of the liquid zone. The triangular shape of the zone is a result of the (111) orientation of the substrate. As the incident laser power is increased, thermal symmetry dominates crystal symmetry forces and the zones tend to become round.

At the center of the zone is a region of substantially pure aluminum which is 5 microns in diameter. This region extends throughout the entire thickness of the wafer. A lighter chemical treatment reveals solidification contours in the "p" zone which confirm that solidification occurred radially from the outer regions of the zone. The central metallic region resulted from solute rejection during the solidification process. The radial components of the temperature gradient caused this rejection to push metal to the center of the zone. This phenomenon was observed for initial aluminum metallization thicknesses greater than 2000 Angstroms.

What is claimed is:
1. A method comprising
   establishing, within an at least two component molten material, an advancing freezing interface which is curved, with at least two tangents from portions of the interface which intersect, the solubility of at least one of the components of the melt being higher in the melt phase than in the solid phase, whereby the at least one component solidifies along the locus of intersecting tangents, with an enriched concentration higher than the average concentration of that component taken over the entire initial molten zone just before the onset of solidification.

2. The method of claim 1 wherein the concentration in substantially the entire melt phase of the at least one component is greater than the liquidus concentration for all temperatures of the melt phase.

3. The method of claim 1 wherein the concentration in the melt phase of the at least one component is greater than the solubility limit of that component in the solid phase.

4. The method of claims 1 through 3 wherein at least one dimension of the solidified enriched component is less than that of the molten zone.

5. The method of claim 4 wherein the shape of the solidified enriched material is substantially cylindrical, tubular, or planar.

6. The method of claim 4 wherein the enriched solidified material is cylindrical with at least one dimension less than 25 percent of that of the molten region.

7. The method of claim 6 wherein the at least one dimension is the diameter dimension and is less than 10 microns.

8. The method of claim 5 wherein the enriched region is adjacent to a solidified alloy material comprising the at least one component.

9. The method of claim 6 wherein the conductivity properties of the solidified enriched material and the alloy material are different.

10. The method of claim 9 wherein the enriched material is conductive.

11. The method of claim 5 wherein the etching properties of the solidified enriched material and the alloy material differ by at least a factor of 10 for at least one etchant.

12. The method of claim 4 wherein the molten material is heated with a point heat source which is removed to initiate freezing of the molten zone.

13. The method of claim 12 wherein the point heat source is a focused light beam, an ion beam, and an electron beam, a resistor heat source, or a laser beam.

14. The method of claim 13 wherein the molten material is transferred to a casting body prior to solidification.

15. The method of claim 13 wherein the molten material is rendered molten using a point heat source.

16. The method of claim 15 wherein the molten material is refrozen without being transferred to a second body.

17. The method of claim 16 wherein the molten region is rendered molten using a temperature gradient zone melting process.

18. The method of claim 17 wherein the at least one component material is drawn into the molten region from one side of the melt.

19. The method of claim 18 wherein the molten region comprises within a semiconductor body.

20. The method of claim 19 wherein the semiconductor body comprises silicon.

21. The method of claim 20 wherein the at least one component comprises aluminum.

22. The method of claim 21 wherein the point heat source is a $CO_2$ laser emitting 10.6 micron light.

23. The method of claim 22 wherein the molten zone is cylindrical with a diameter greater than 20 microns.

24. The method of claim 23 wherein an aluminum rich wire has a diameter less than 10 microns formed.

* * * * *

UNITED STATES PATENT AND TRADEMARK OFFICE
CERTIFICATE OF CORRECTION

PATENT NO. : 4,394,183

DATED : July 19, 1983

INVENTOR(S) : Kenneth A. Jackson and Lionel C. Kimerling

It is certified that error appears in the above—identified patent and that said Letters Patent is hereby corrected as shown below:

Column 7, line 8, "through" should read --though--; line 35, "disccusion" should read --discussion--; line 46, "top" should read --too--. Column 8, line 5, "whole" should read --hole--.

Signed and Sealed this

First Day of November 1983

[SEAL]

Attest:

GERALD J. MOSSINGHOFF

Attesting Officer   Commissioner of Patents and Trademarks